(12) United States Patent
Yamanaka et al.

(10) Patent No.: US 8,317,971 B2
(45) Date of Patent: Nov. 27, 2012

(54) PLASMA PROCESSING APPARATUS AND METHOD OF MANUFACTURING MAGNETIC RECORDING MEDIUM

(75) Inventors: Kazuto Yamanaka, Sagamihara (JP); Akio Sato, Kawasaki (JP)

(73) Assignee: Canon Anelva Corporation, Kawasaki-shi (JP)

( * ) Notice: Subject to any disclaimer, the term of this patent is extended or adjusted under 35 U.S.C. 154(b) by 0 days.

(21) Appl. No.: 13/197,278

(22) Filed: Aug. 3, 2011

(65) Prior Publication Data
US 2011/0284497 A1 Nov. 24, 2011

Related U.S. Application Data

(63) Continuation of application No. PCT/JP2010/004848, filed on Jul. 30, 2010.

(30) Foreign Application Priority Data

Jul. 31, 2009 (JP) .................................. 2009-179425

(51) Int. Cl.
C23C 16/00 (2006.01)
H01L 21/306 (2006.01)

(52) U.S. Cl. ......... 156/345.48; 156/345.35; 156/345.36; 156/345.49; 118/723 IR; 118/723 AN; 118/723 MR; 118/723 ME (58) Field of Classification Search ................ 118/723 I, 118/723 IR, 723 AN, 723 ME, 723 MR; 156/345.35, 156/345.36, 345.48, 345.49; 315/111.51
See application file for complete search history.

(56) References Cited

U.S. PATENT DOCUMENTS

| 5,651,867 A | 7/1997 | Kokaku et al. |
| 6,223,686 B1 * | 5/2001 | Suzuki et al. ......... 118/723 MW |
| 6,669,807 B2 * | 12/2003 | Nakatani .................... 156/345.1 |
| 6,682,630 B1 * | 1/2004 | Colpo et al. ............. 156/345.48 |

FOREIGN PATENT DOCUMENTS

| JP | 3-120362 A | 5/1991 |
| JP | 5-140752 A | 6/1993 |
| JP | 6-248458 A | 9/1994 |
| JP | 2008-124281 A | 5/2008 |

* cited by examiner

*Primary Examiner* — Luz L. Alejandro
(74) *Attorney, Agent, or Firm* — Fitzpatrick, Cella, Harper & Scinto (57) ABSTRACT

A plasma processing apparatus includes a discharge window made of a dielectric material, a discharge chamber which is grounded and includes an opening formed at its one end and the discharge window provided at its other end facing the opening, a gas supply system which supplies a gas into the discharge chamber, a high-frequency power application mechanism which applies a high-frequency power to the gas to generate a plasma inside the discharge chamber, a substrate holder which can hold a substrate while facing the discharge window on the outer side of the discharge chamber, a shielding member which partially shields the plasma that impinges on the substrate, and a supporting member which supports the shielding member. The supporting member is grounded and fixed on the shielding member at a position which is farther from the substrate than the shielding member and different from that of the discharge window.

6 Claims, 10 Drawing Sheets

WIRE OR MESH MEMBER IS USED AS ARM PORTION

F I G. 9B

ARM PORTION IS TILTED

F I G. 9C

DISTAL END IS FORMED IN CONICAL SHAPE IN PLACE OF CYLINDRICAL SHAPE

FIG. 9D  RING IS PROVIDED ON OUTER PERIPHERY

FIG. 9E  CONNECTING MEMBER IS CONNECTED TO INTERNAL SHIELD IN PLACE OF SHIELD

FIG. 9F  EXTEND SUPPORTING MEMBER FROM CENTER

PLASMA PROCESSING APPARATUS AND METHOD OF MANUFACTURING MAGNETIC RECORDING MEDIUM

CROSS-REFERENCE TO RELATED APPLICATIONS

This application is a continuation of International Application No. PCT/JP2010/004848, filed Jul. 30, 2010, which claims the benefit of Japanese Patent Application No. 2009-179425, filed Jul. 31, 2009. The contents of the aforementioned applications are incorporated herein by reference in their entirety.

TECHNICAL FIELD

The present invention relates to a plasma processing apparatus and a method of manufacturing a magnetic recording medium. The present invention more particularly relates to a plasma processing apparatus which improves the in-plane uniformities of the process distributions of, for example, etching and deposition on a processing object, and a method of manufacturing a magnetic recording medium using the same.

BACKGROUND ART

A reactive ion etching apparatus and a CVD apparatus must improve the in-plane uniformity of a substrate process in preparation for an etching process and a deposition process which uses the CVD method.

As a technique for improving the in-plane uniformity of the etching distribution, a dry etching apparatus disclosed in, for example, PTL1 includes a charged particle generation unit which emits charged particles, a rotating stage which rotates while supporting a plurality of processing objects irradiated with the charged particles, and a shielding plate which is provided between the charged particle generation unit and the rotating stage and shields the charged particles emitted by the charged particle generation unit. By pivoting the shielding plate to adjust the size of a projection of the shielding plate, which is formed on the processing object, the in-plane irradiation amount of charged particles guided from the charged particle generator to the processing object is adjusted.

Also, to prevent plasma concentration on a disk substrate, PTL2 discloses a plasma processing apparatus including a vacuum vessel, an exhaust means for maintaining the pressure in the vacuum vessel to be lower than the atmospheric pressure, an electrode for generating a plasma in the vacuum vessel, a voltage supply means for applying a voltage to the electrode, and a means for supplying a gaseous substance to a plasma generation unit. Upon defining this plasma processing apparatus as one set, one vacuum process vessel includes two sets, so the plasma processing apparatuses perform plasma processing on the two surfaces of the disk substrate. PTL2 also discloses two electrodes that are formed by an electrode member with a shape that can surround a space which is located on the two target surfaces of the disk substrate and in which a plasma is generated, and that which juts in a portion facing a hole at the center of the disk substrate.

CITATION LIST

Patent Literature

PTL1: Japanese Patent Laid-Open No. 2008-124281
PTL2: Japanese Patent Laid-Open No. 5-140752

SUMMARY OF INVENTION

Technical Problem

Unfortunately, in PTL1 mentioned above, the in-plane uniformity of a substrate process cannot be sufficiently improved due to the influence of an arm which supports the shielding plate. Also, in PTL2 mentioned above, a supporting member which supports the electrode member that juts in the portion facing the hole at the center of the disk substrate extends in a direction away from the substrate, thereby being connected to an insulating material. In a capacitively coupled plasma generation apparatus, the supporting member becomes an obstacle to applying a voltage to a gas for plasma formation in a discharge chamber by a high-frequency power supply.

Solution To Problem

The present invention has been made in consideration of the above-mentioned situation, and has as its object to provide a plasma processing apparatus which can improve the in-plane uniformity of a process on a processing object and can easily discharge.

In order to achieve the above-mentioned object, according to one aspect of the present invention, there is provided a plasma processing apparatus comprising:
 a discharge window made of a dielectric material;
 a discharge chamber which is grounded and includes an opening formed at one end thereof and the discharge window provided at the other end thereof facing the opening;
 a gas supply system which supplies a gas into the discharge chamber;
 a high-frequency power application mechanism which applies a high-frequency power to the gas to generate a plasma inside the discharge chamber;
 a substrate holder which can hold a substrate while facing the discharge window on an outer side of the discharge chamber;
 a shielding member which partially shields the plasma that impinges on the substrate; and
 a supporting member which supports the shielding member,
 wherein the supporting member is grounded and fixed on the shielding member at a position which is farther from the substrate than the shielding member and different from a position of the discharge window.

In order to achieve the above-mentioned object, according to another aspect of the present invention, there is provided a method of manufacturing a magnetic recording medium using a plasma processing apparatus comprising:
 a discharge window made of a dielectric material;
 a discharge chamber which is grounded and includes an opening formed at one end thereof and the discharge window provided at the other end thereof facing the opening;
 a gas supply system which supplies a gas into the discharge chamber;
 a high-frequency power application mechanism which applies a high-frequency power to the gas to generate a plasma inside the discharge chamber;
 a substrate holder which can hold a substrate while facing the discharge window on an outer side of the discharge chamber;
 a shielding member which partially shields the plasma that impinges on the substrate; and
 a supporting member which supports the shielding member, wherein the supporting member is grounded and fixed on the shielding member at a position which is farther from the substrate than the shielding member and different from a position of the discharge window, the method comprising:

a step of introducing a process gas into the discharge chamber;

a step of introducing a reactive gas into the discharge chamber; and a step of generating a plasma inside the discharge chamber by the high-frequency power application mechanism.

ADVANTAGEOUS EFFECTS OF INVENTION

According to the present invention, it is possible to provide a plasma processing apparatus which can easily generate a plasma in a discharge chamber, and improve the in-plane uniformity of a process on a processing object.

Other features and advantages of the present invention will be apparent from the following descriptions taken in conjunction with the accompanying drawings, in which like reference characters designate the same or similar parts throughout the figures thereof.

BRIEF DESCRIPTION OF DRAWINGS

The accompanying drawings, which are incorporated in and constitute a part of the specification, illustrate embodiments of the invention and, together with the description, serve to explain the principles of the invention.

DESCRIPTION OF EMBODIMENTS

Figure 1:
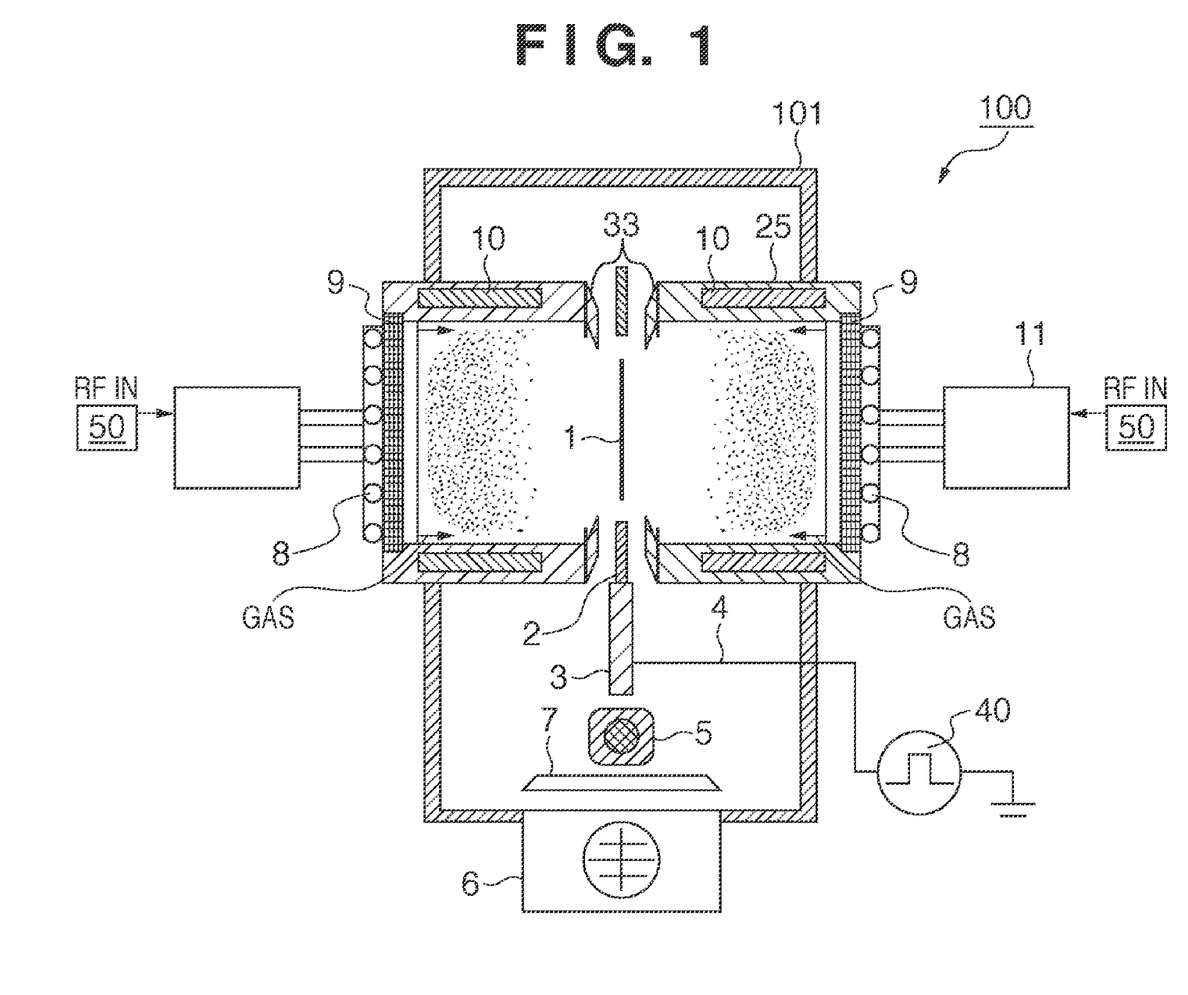
FIG. 1 is a schematic side sectional view of a plasma processing apparatus according to an embodiment.
Figure 2:
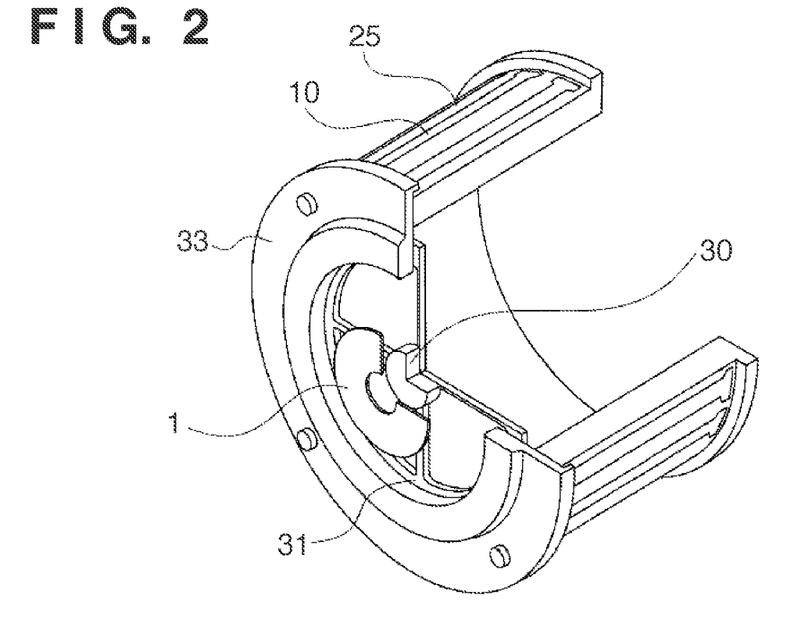
FIG. 2 is an enlarged perspective view of a shielding member applicable to the plasma processing apparatus according to the embodiment.
Figure 3:
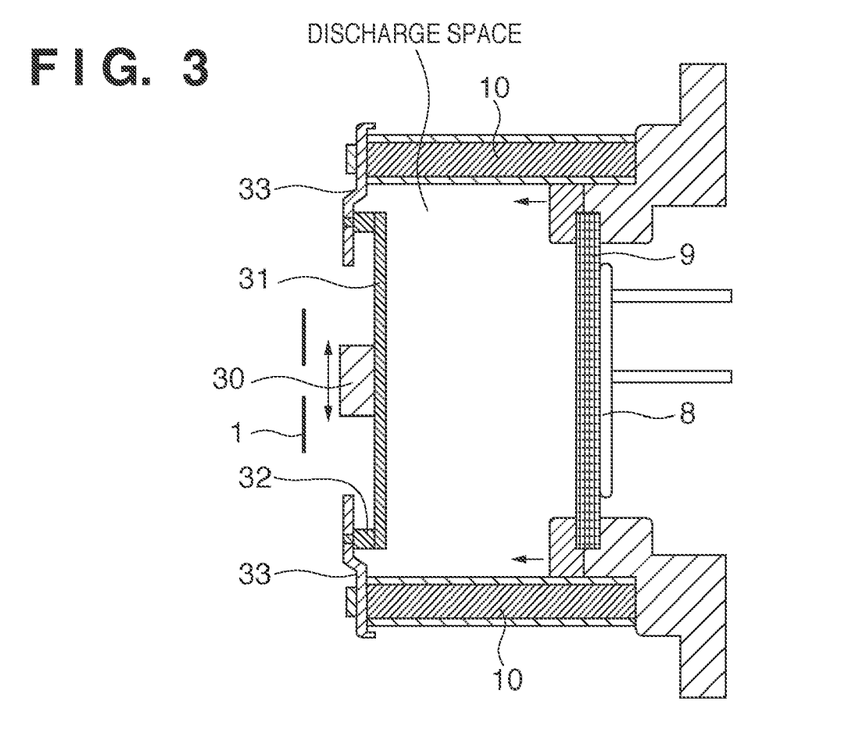
FIG. 3 is an enlarged side sectional view of a discharge space in the plasma processing apparatus according to the embodiment.
Figure 4:
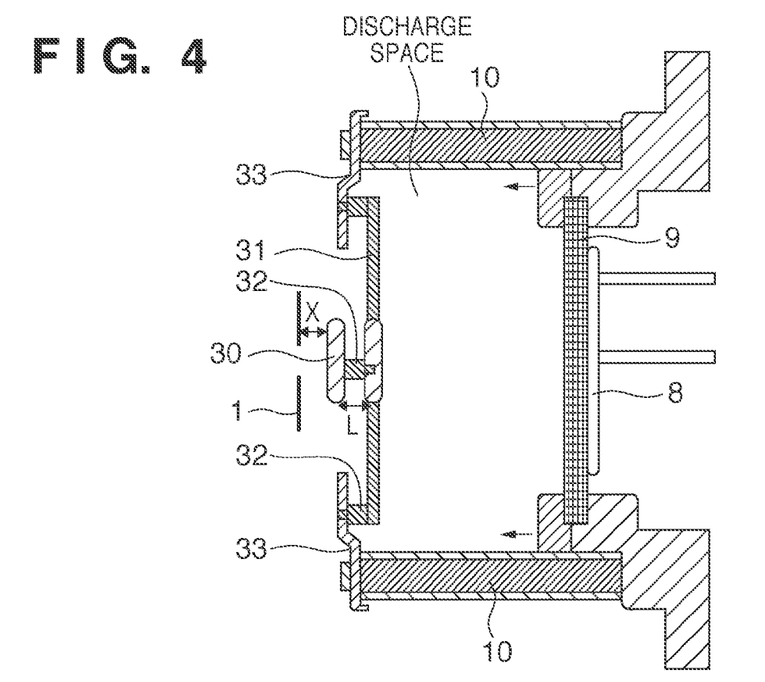
FIG. 4 is an enlarged side sectional view of another discharge space in the plasma processing apparatus according to the embodiment.

FIG. 1 is a schematic side sectional view of a plasma processing apparatus applicable to the present invention. FIG. 2 is an enlarged perspective view of a shielding member. FIGS. 3 and 4 are side sectional views of plasma process vessels applicable to the present invention.

Although a reactive ion etching (RIE) apparatus will be described as a representative of the plasma processing apparatus in this embodiment, the plasma processing apparatus is not limited to a specific one, and may be, for example, an ion beam apparatus, an etching apparatus, or a CVD apparatus. A substrate 1 is a disk-shaped glass substrate, which has a circular opening at its center. However, the substrate 1 is not limited to a glass substrate, and may be, for example, a silicon substrate or an aluminum substrate.

FIG. 1 shows a reactive ion etching (RIE) apparatus 100 as an example of the plasma processing apparatus. The reactive ion etching (RIE) apparatus 100 mainly includes a discharge chamber 25 within which a plasma is generated by gas discharge, a gas supply system which supplies a gas (a mixed gas of argon, oxygen, and $CF_4$), and a high-frequency power application mechanism which applies a high-frequency power to the gas in the discharge chamber 25. The high-frequency power application mechanism mainly includes an antenna (coil) 8, a high-frequency power supply 50 which supplies a high-frequency current to the antenna 8 to induce a high-frequency magnetic field in the discharge chamber 25, and a matching box 11 provided on the circuit between the high-frequency power supply 50 and the antenna 8. Note that the discharge chamber 25 is grounded.

As shown in FIG. 2, the discharge chamber 25 is a hollow cylindrical housing (cylindrical tube) disposed between the substrate 1 and the antenna 8, and has an opening on the side of the substrate 1. An annular shield 33 is provided in the opening of the discharge chamber 25 on the side of the substrate 1 to extend toward the substrate 1. Although not shown, the gas supply system includes, for example, a cylinder which stores a gas to be supplied, a pipe which connects the cylinder and the discharge chamber 25 to each other, a valve provided to the pipe, a flow controller, and a filter. As shown in FIG. 1, the discharge chamber 25 has its one end open to the substrate 1, and its other end provided with a discharge window 9 made of a dielectric material. The antenna 8 is a three-turn coil. Although the coil-shaped antenna 8 has three coil turns in this embodiment, the number of coil turns is not limited to a specific value, and may be, for example, about 0.5 to several dozens. The optimum number of coil turns corresponding to the frequency of a high-frequency wave is determined by experiments. At a frequency of, for example, 13.56 MHz, the number of coil turns falls within the range of 1 to 5. As the high-frequency power supply 50, a high-frequency power supply which supplies a power with an arbitrary frequency within the range of several hundred kilohertz to several ten megahertz is used. The output is appropriately determined in accordance with, for example, the inside diameter of the discharge chamber 25 and the pressure in the discharge chamber 25. Note that the discharge chamber 25 has a relatively compact size to confine a high-density plasma, and the distance from the discharge window 9 to the substrate 1 is, for example, 200 mm or less (114 mm in this embodiment), but discharge can easily take place when the distance between the discharge window 9 and a supporting member 31 is, for example, 30 mm or more and is more preferably 50 mm or more.

One discharge chamber 25 is provided in correspondence with each of the two surfaces (target surfaces) of the substrate 1 held such that the substrate surface stands upright (in the vertical state), as shown in FIG. 1. Similarly, an antenna 8, discharge window 9, magnet 10, gas supply system, high-frequency power application mechanism, shielding member, and supporting member are also provided in correspondence with each of the two surfaces of the substrate 1. This makes it possible to perform an etching process simultaneously on the two surfaces of the substrate 1. A substrate holder 2 can hold the substrate 1 while facing the discharge window 9 on the outer side of the discharge chamber 25. A slider 3 is attached to the lower portion of the substrate holder 2, and the substrate holder 2 can be transported by a transport means 5. An exhaust means (turbo-molecular pump) is attached to a process vessel 101, and can reduce the pressure in the process vessel 101 to a predetermined pressure (vacuum pressure). A bias application mechanism 4 for applying a pulsed bias to the substrate holder 2 is connected to the substrate holder 2, and applies a pulsed bias, thereby allowing high-accuracy etching.

The arrangement of the shielding member that is a feature portion of the present invention will be described next with reference to FIGS. 2 and 3. The shielding member partially shields a plasma guided from the opening of the discharge chamber 25 to the substrate holder. FIG. 2 is an enlarged perspective view of the shielding member. FIG. 3 is an enlarged side sectional view of a discharge space in a plasma processing apparatus including a cylindrical shielding member. Note that the same reference numerals as in FIG. 1 denote the same parts in FIGS. 2 and 3, and a description thereof will not be given. Although a pair of discharge chambers 25 face the substrate 1 so as to process the two surfaces of the substrate 1 in FIG. 1, only one discharge chamber 25 will be described as needed for the sake of simplicity in FIG. 2 and subsequent drawings.

As shown in FIG. 2, a shielding member 30 for partially shielding the substrate 1 against a plasma generated in the discharge chamber 25 is supported by a cruciform supporting member 31 in the vicinity of the opening at the center of the substrate 1 held in the vertical state by the substrate holder (not shown). The supporting member 31 is disposed inside the discharge chamber 25 through a member different from the discharge window 9, such as the shield 33, and supports the shielding member 30 to be positioned on the side of the opening of the discharge chamber 25. The shielding member 30 is a member which is less likely to suffer dielectric heating and thermal deformation, such as a cylindrical member made of stainless steel (SUS310), and is disposed such that its flat surface becomes almost parallel (including parallel) to the substrate surface. The center of the opening in the substrate 1 and that of the surface of the shielding member 30 are desirably coaxially aligned. The shielding member 30 is provided in the vicinity of the center of the substrate 1 to prevent the central portion of the substrate 1 from being excessively etched because the plasma density in the discharge chamber 25 is relatively high in the vicinity of the central axis of the discharge chamber 25 and is relatively low on the side of its inner wall.

Note that the discharge chamber 25 is grounded, and the supporting member 31, shielding member 30, and annular shield 33 connected to the discharge chamber 25 are grounded as well. The shielding member 30 and other members are grounded for the following reason. For example, when the shielding member 30 is floating, ions and electrons in the plasma are charged by the shielding member 30, so the voltage changes with time and becomes unstable. Also, if a positive potential is applied to the shielding member 30, electrons flow from the plasma into the shielding member 30, and this may generate heat in the shielding member 30. Furthermore, in this case, a power supply for applying a positive voltage to the shielding member 30 becomes necessary, thus complicating the apparatus. Similarly, if a negative potential is applied to the shielding member 30, positive ions flow from the plasma into the shielding member 30 and are consumed, and this lowers the overall etching rate. Furthermore, in this case, a power supply for applying a negative voltage to the shielding member 30 becomes necessary, thus complicating the apparatus.

FIG. 3 is an enlarged side sectional view of a discharge space in a plasma processing apparatus including a disk-shaped shielding member 30. The supporting member 31 is grounded and fixed on the shielding member 30 at a position which is farther from the substrate than the shielding member 30 and different from that of the discharge window. FIG. 4 shows a shielding member 30 which has the same features as those of the shielding member 30 shown in FIG. 3 except for the shape. That is, the shielding member 30 shown in FIG. 4 has a 30-mm diameter disk shape, and is provided with a rod-like connecting member 32 for connecting the center of the disk-shaped shielding member 30 and that of the cruciform supporting member 31 to each other. The distance between the shielding member 30 and the substrate 1 can be adjusted by appropriately setting the length of the connecting member 32. Although the connecting member 32 has a length L=12.4 mm in this embodiment, the length of the connecting member 32 is not limited to a specific value.

The shielding member 30 is fixed by the cruciform supporting member 31 with respect to the annular shield 33 which surrounds it, as shown in FIG. 3. Namely, the plasma from the discharge chamber 25 can process the substrate 1 upon passing through the space between the shielding member 30 and the annular shield 33, as shown in FIG. 2. The supporting member 31 is not limited to a cruciform supporting member, and may include one or two or more arms or be a mesh or grid supporting member 31. The arm of the supporting member 31 is desirably point-symmetrical from the viewpoint of the uniformity of a process on the substrate 1.

The surface of the shielding member 30, which faces the substrate 1, is closer to the substrate 1 than the supporting member 31. In other words, the supporting member 31 is farther from the substrate 1 than the shielding member 30, as shown in FIGS. 3 and 4. This is to prevent a nonuniform substrate process as the supporting member 31 shields the plasma from the discharge chamber 25. Details of this arrangement will be described later.

Figure 5:
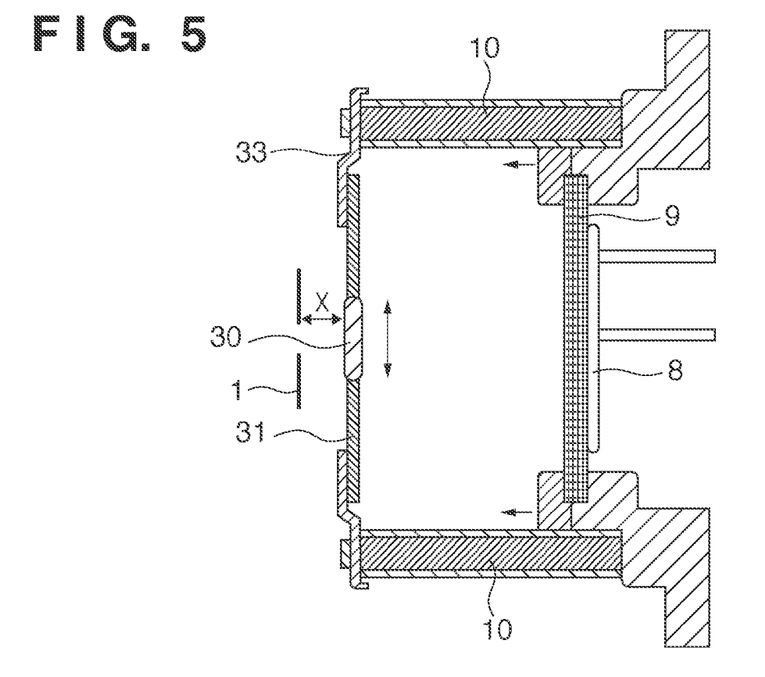
FIG. 5 is a side sectional view of a plasma process vessel used as a Comparative Example.

The process distribution characteristics on the substrate are evaluated by comparing the above-mentioned plasma processing apparatus including the shielding member 30 according to the embodiment of the present invention shown in FIG. 4 with a plasma processing apparatus including a shielding member 30 according to a Comparative Example shown in FIG. 5. Referring to FIG. 4, X is the distance between the surface of the substrate 1 and that of the shielding member 30, and L is the distance between the shielding member 30 and the supporting member 31, and both the distances X and L can be adjusted as needed. The diameter of the substrate 1 is 65 mm, the inside diameter of the opening in the substrate 1 is 20 mm, the diameter of the disk-shaped shielding member 30 is 30 mm, and the diameter of the opening in the annular shield 33 is 120 mm. The length of the connecting member 32 shown in FIG. 4 is L=12.4 mm. The plasma processing apparatus including the shielding member according to the Comparative Example shown in FIG. 5 has the same arrangement as that shown in FIG. 4, except that in the former the shielding member 30 and supporting member 31 are formed on the same level. Namely, in the Comparative Example shown in FIG. 5, the length of the connecting member 32 shown in FIG. 4 is L=0 mm. The distance X between the surface of the substrate 1 and that of the shielding member 30 shown in FIG. 5 is 14 mm.

Figure 6A:
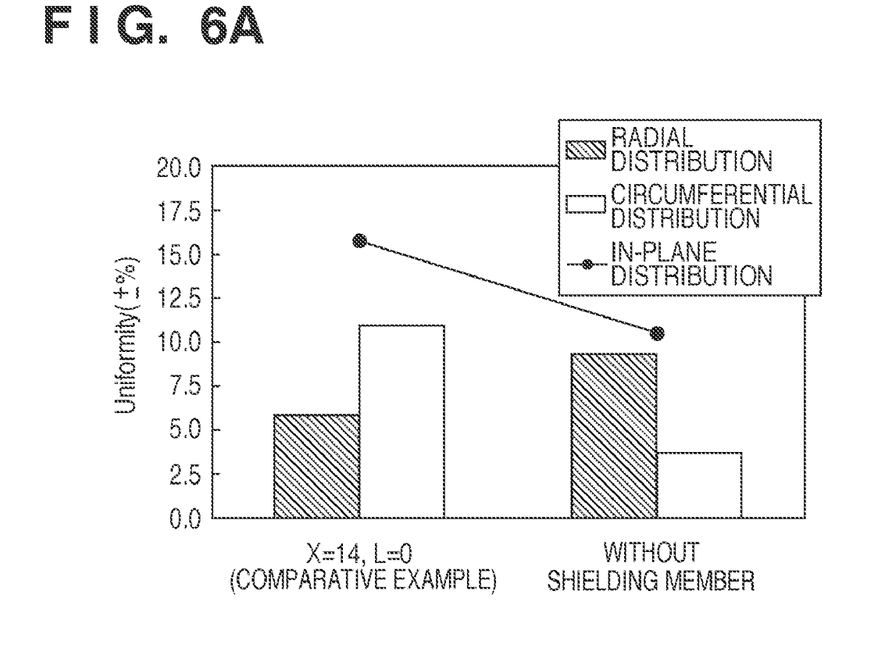
FIG. 6A is a graph for explaining the evaluation results of the process distribution characteristics.
Figure 6B:
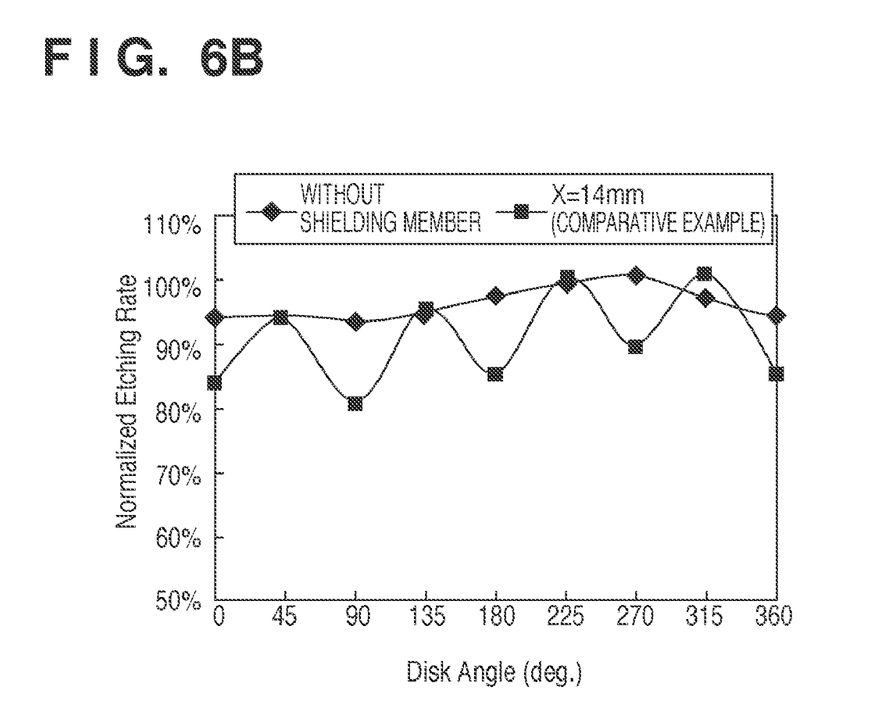
FIG. 6B is a graph for explaining the evaluation results of the process distribution characteristics.

FIGS. 6A and 6B show the evaluation results of the process distribution characteristics on the substrate when a plasma processing apparatus including no shielding member 30 is compared with that according to the Comparative Example shown in FIG. 5. In a graph shown in FIG. 6A, the abscissa indicates items, and the ordinate indicates the radial, circumferential, and in-plane distributions. FIG. 6A shows in the left part a case in which the plasma processing apparatus including the shielding member according to the Comparative Example shown in FIG. 5 is used, and shows in the right part a case in which none of the shielding member 30, supporting member 31, etc. are used. FIG. 6B shows the circumferential distributions.

A method of measuring the radial distributions shown in FIG. 6A is as follows. That is, the etching rate is measured at points R=15, 20, 25, and 30 mm on the substrate in the radial direction. The etching rate is also measured at points obtained by rotating the measured points through 90°, 180°, and 270°. In this way, the average of the etching rates for each radius is obtained. Maximum and minimum values are obtained among all the obtained averages, and the radial distribution (the uniformity of the etching rate in the radial direction) is obtained by an equation:

(Maximum Value−Minimum Value)/(Maximum Value+Minimum Value)×100 (±%).

A method of measuring the circumferential distributions shown in FIG. 6A is as follows. That is, the etching rate is measured at a point R=25 mm on the substrate in the radial direction. The etching rate is also measured at points obtained by rotating the measured point through 45°, 90°, 135°, 180°, 225°, 270°, and 315°. Maximum and minimum values are obtained among the measured values, and the circumferential distribution (the uniformity of the etching rate in the circumferential direction) is obtained by an equation: (Maximum Value−Minimum Value)/(Maximum Value+Minimum Value)×100 (±%). Note that the uppermost point of the substrate held upright was assumed to be 0°, and its lowermost point was assumed to be 180°. FIG. 6B shows the thus measured circumferential distributions upon defining the circumferential angle of the substrate on the abscissa, and the etching rate ratio assuming that the maximum value is 100% on the ordinate.

A method of measuring the in-plane distributions shown in FIG. 6A is as follows. That is, maximum and minimum values are obtained from the etching rates at the measurement points for the radial and circumferential distributions mentioned above, and the in-plane distribution (the in-plane uniformity of the etching rate) is obtained by an equation: (Maximum Value−Minimum Value)/(Maximum Value+Minimum Value)×100 (±%).

As can be seen from these evaluation results, the radial distribution is better but the circumferential distribution is poorer when the shielding member 30 is used than when no shielding member 30 is used, as shown in FIG. 6A. The circumferential direction deteriorates at 0°, 90°, 180°, and 270°, as shown in FIG. 6B, and this reveals that the poorer circumferential distribution results from factors associated with the cruciform supporting member. As a result, even when the shielding member 30 is used, as in the Comparative Example, an improvement in overall in-plane uniformity cannot be achieved, as shown in FIG. 6A.

Figure 7A:
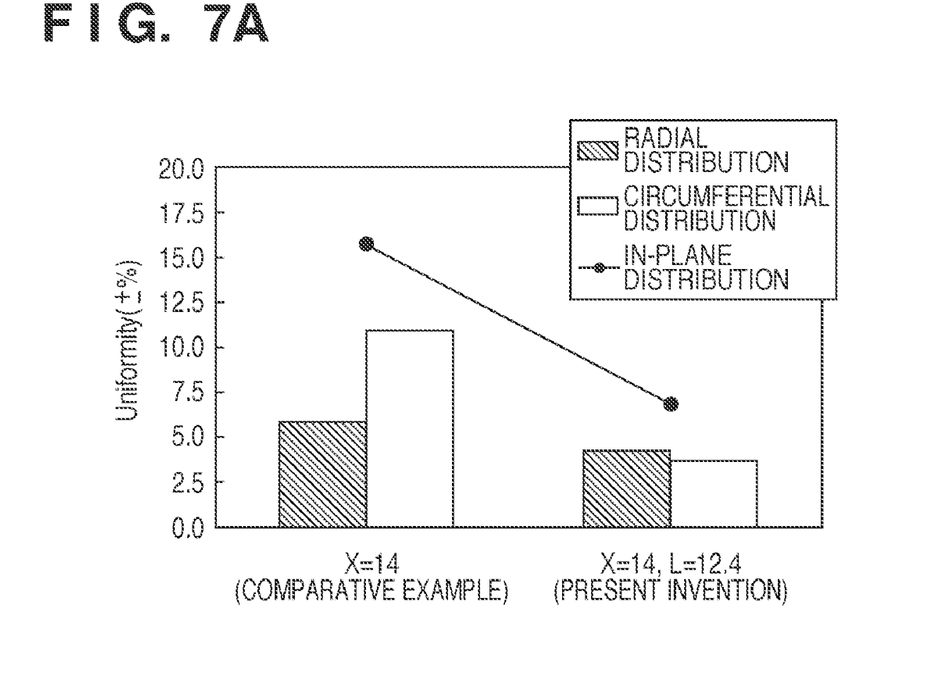
FIG. 7A is a graph for explaining the evaluation results of the process distribution characteristics.
Figure 7B:
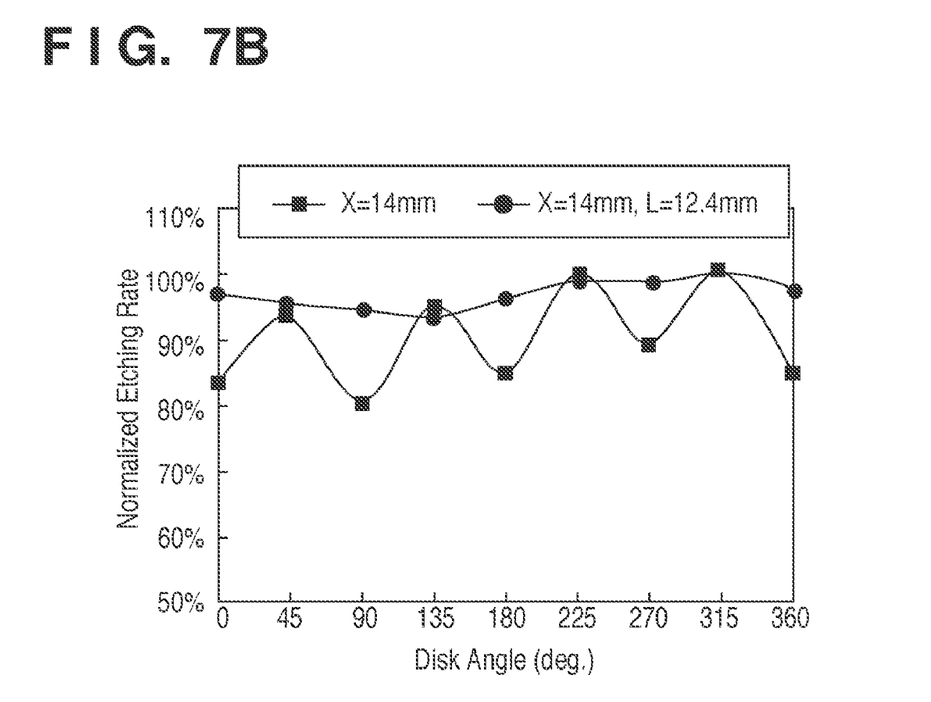
FIG. 7B is a graph for explaining the evaluation results of the process distribution characteristics.

FIGS. 7A and 7B show the process distribution characteristics when a case in which the plasma processing apparatus including the shielding member 30 according to the Comparative Example shown in FIG. 5 is used is compared with that in which the supporting member 31 is moved away from the substrate 1 without changing the position of the shielding member 30 relative to the substrate 1 using the connecting member 32, as shown in FIG. 4. By keeping the supporting member 31 farther away from the substrate than the shielding member 30, as in the plasma processing apparatus according to the embodiment of the present invention, the circumferential distribution improves, and the in-plane uniformity also improves, as shown in FIG. 7A. By keeping the supporting member 31 farther away from the substrate than the shielding member, as shown in FIG. 7B, the adverse effect exerted by the supporting member 31 can be reduced. The distance between the shielding member 30 and the supporting member 31 is preferably 3 mm or more and is more preferably 10 mm or more.

Figure 8A:
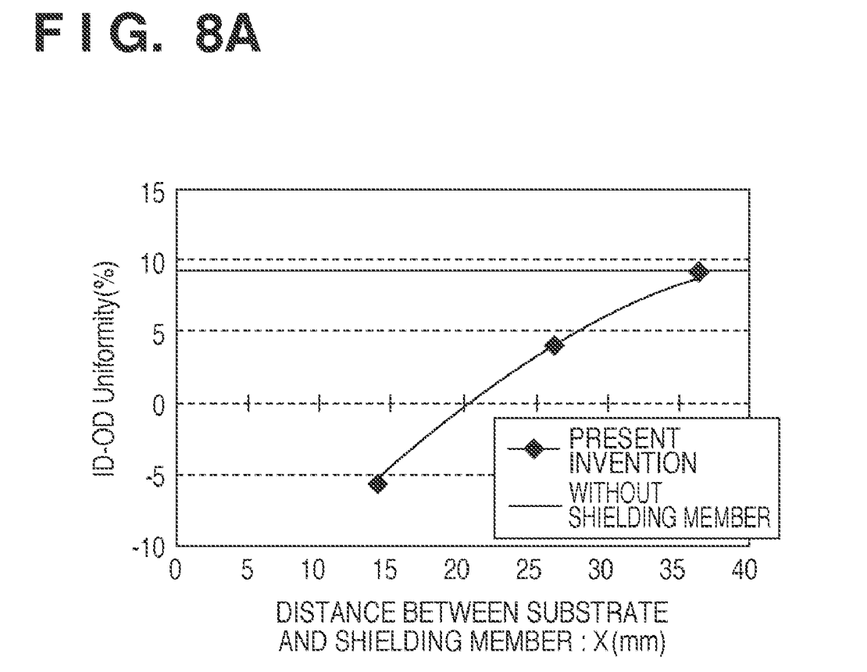
FIG. 8A is a graph showing the relationship between the distance between a substrate and a shielding member, and the ID-OD radial distribution.
Figure 8B:
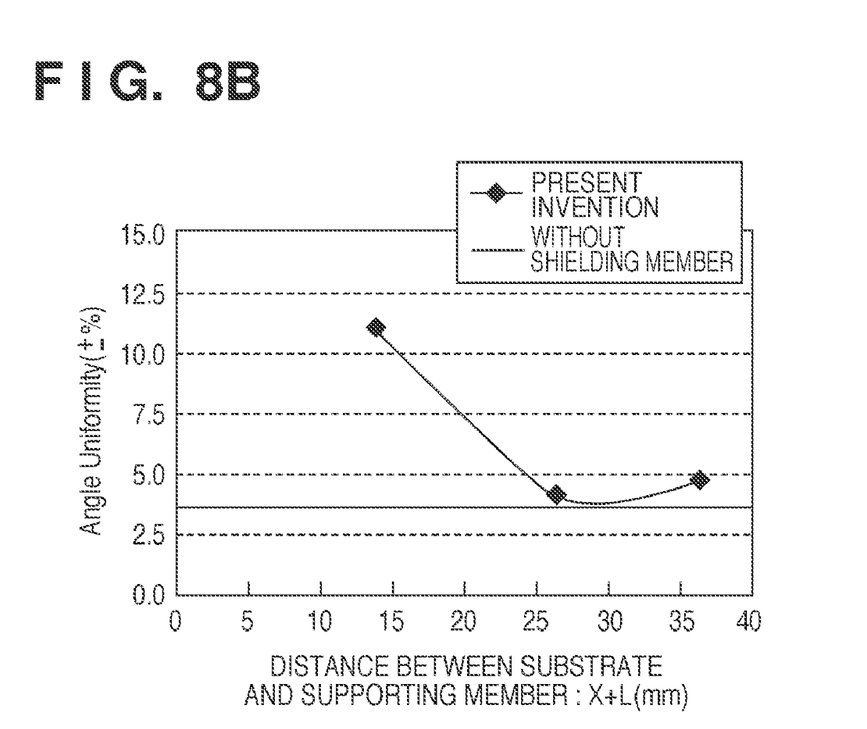
FIG. 8B is a graph showing the relationship between the distance between the substrate and a supporting member, and the circumferential uniformity distribution.

FIG. 8A shows the relationship between the distance X between the substrate 1 and the shielding member 30, and the ID-OD radial distribution. Referring to FIG. 8A, ID is an abbreviation for "Inside Diameter", and OD is an abbreviation for "Outside Diameter". The ID-OD distribution can be obtained by obtaining the values on the innermost and outermost peripheries from the etching rate measurement results obtained by the radial distributions, and solving an equation: (Value on Innermost Periphery−Value on Outermost Periphery)/(Value on Innermost Periphery+Value on Outermost Periphery)×100 (±%). FIG. 8B shows the relationship between the distance L between the substrate and the supporting member, and the circumferential uniformity distribution. The process distribution characteristics shown in FIG. 8B were measured using the same method as that described with reference to FIG. 6A.

To keep the ID-OD uniformity within the range of ±5%, the distance X between the substrate 1 and the shielding member 30 is preferably 16 mm to 27 mm, as shown in FIG. 8A. Also, the value X+L is preferably 26 mm or more, as shown in FIG. 8B. Hence, the distance L between the shielding member 30 and the supporting member 31 is preferably 10 mm or more. However, the distance L between the shielding member 30 and the supporting member 31 is not limited to specific values, and a uniformity higher than that in the Comparative Example shown in FIG. 5 could be achieved even when this distance is 3 mm or more.

Figure 9A:
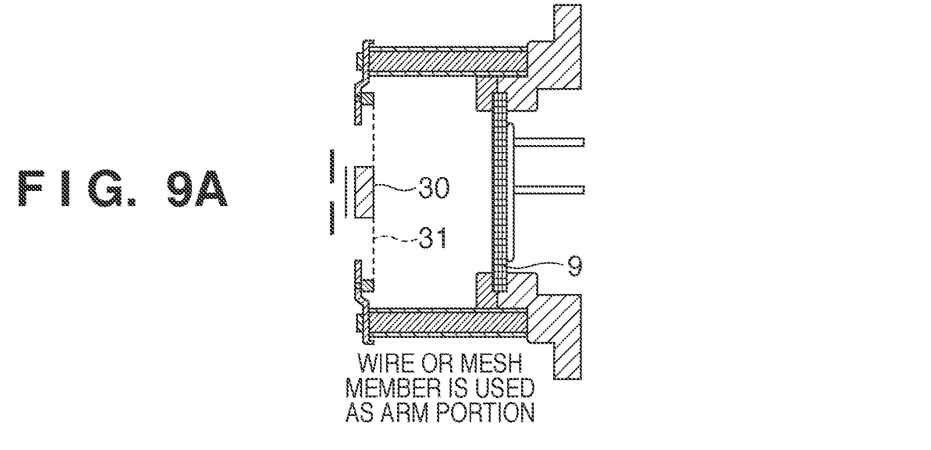
FIG. 9A is a view showing a modification of the shielding member applicable to the plasma processing apparatus according to the embodiment.
Figure 9B:
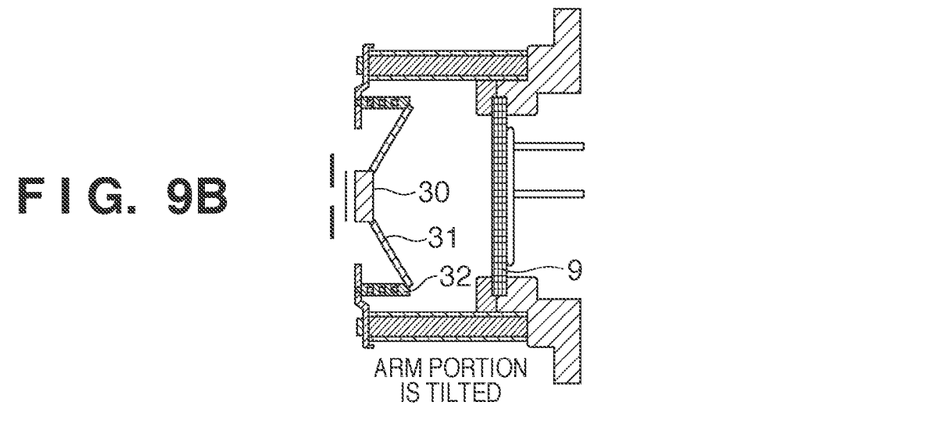
FIG. 9B is a view showing another modification of the shielding member applicable to the plasma processing apparatus according to the embodiment.
Figure 9C:
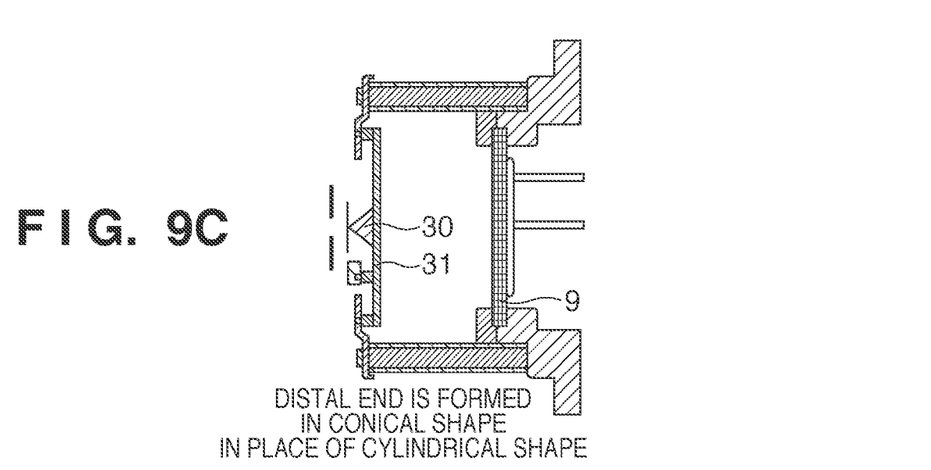
FIG. 9C is a view showing still another modification of the shielding member applicable to the plasma processing apparatus according to the embodiment.
Figure 9D:
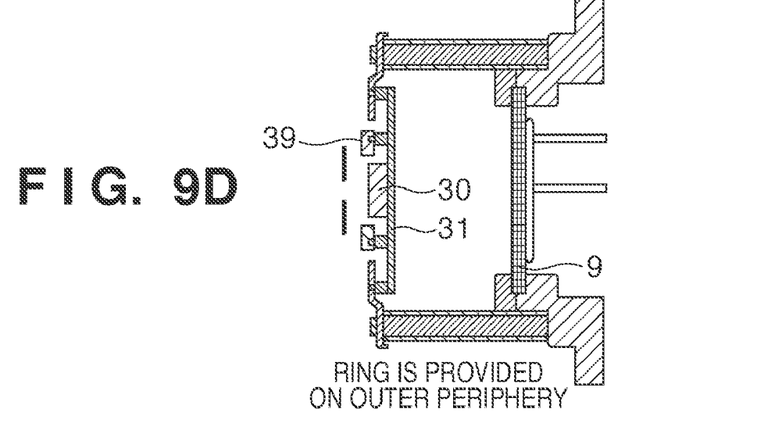
FIG. 9D is a view showing still another modification of the shielding member applicable to the plasma processing apparatus according to the embodiment.
Figure 9E:
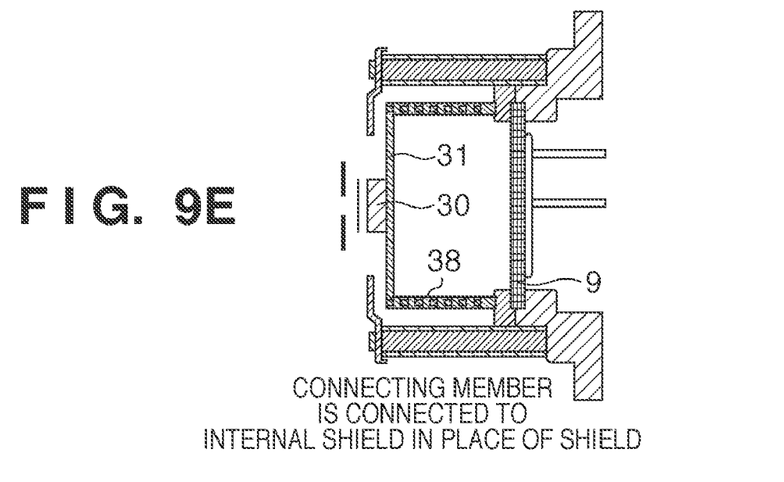
FIG. 9E is a view showing still another modification of the shielding member applicable to the plasma processing apparatus according to the embodiment.
Figure 9F:
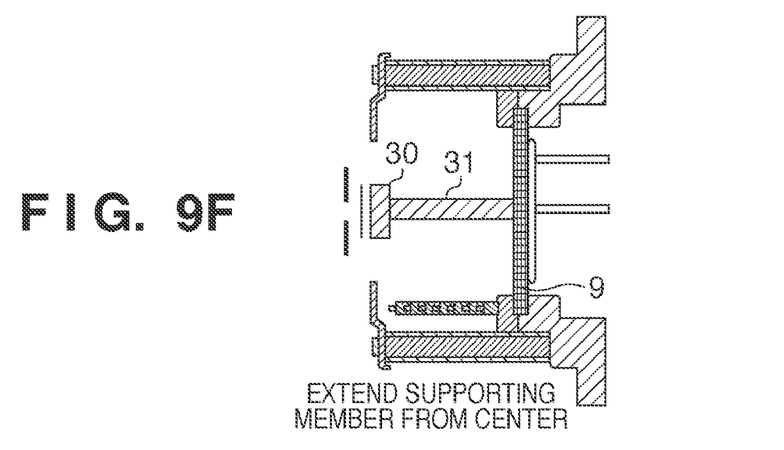
FIG. 9F is a view showing still another modification of the shielding member applicable to the plasma processing apparatus according to the embodiment.
Figure 10:
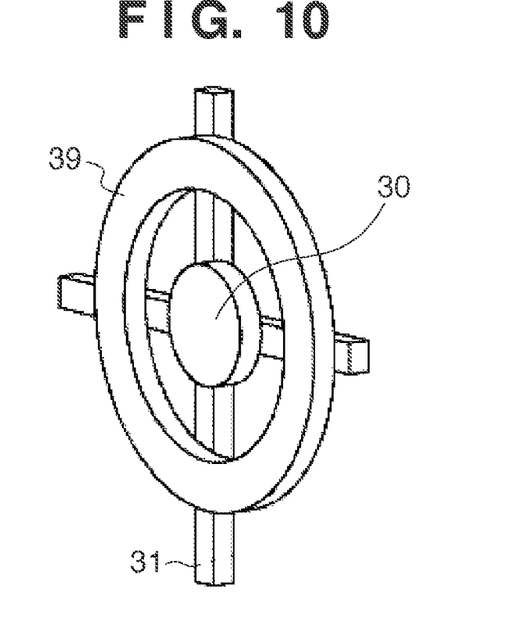
FIG. 10 is an enlarged perspective view of the shielding member shown in FIG. 9D.

FIGS. 9A to 9F are views for explaining modifications of, for example, the shielding member according to the embodiment of the present invention. As shown in FIG. 9A, by shaping the supporting member 31 which surrounds the shielding member 30 into mesh and grid patterns, the uniformity of a process on the substrate can be improved. In the modification shown in FIG. 9B, the connecting member 32 extends in a direction away from the substrate 1. To support the shielding member 30 in the vicinity of the substrate from the end of the connecting member 32, the supporting member 31 is obliquely disposed. In the modification shown in FIG. 9C, a conical shielding member is provided to have its distal end facing the substrate 1. In the modification shown in FIG. 9D, an annular shielding member 39 surrounds the disk-shaped shielding member 30 shown in FIG. 3 with a spacing between them. FIG. 10 is an enlarged perspective view of the shielding member 39 shown in FIG. 9D. In the modification shown in FIG. 9E, the supporting member 31 is connected to a shield 38 inside the discharge chamber 25 in place of the annular shield 33. FIG. 9F shows a Comparative Example, in which the supporting member 31 which supports the shielding member 30 extends in a direction away from the substrate, thereby being connected to the center of the discharge window 9. In this case, the supporting member 31 connected to the discharge window 9 becomes an obstacle to bringing about plasma discharge.

Figure 11:
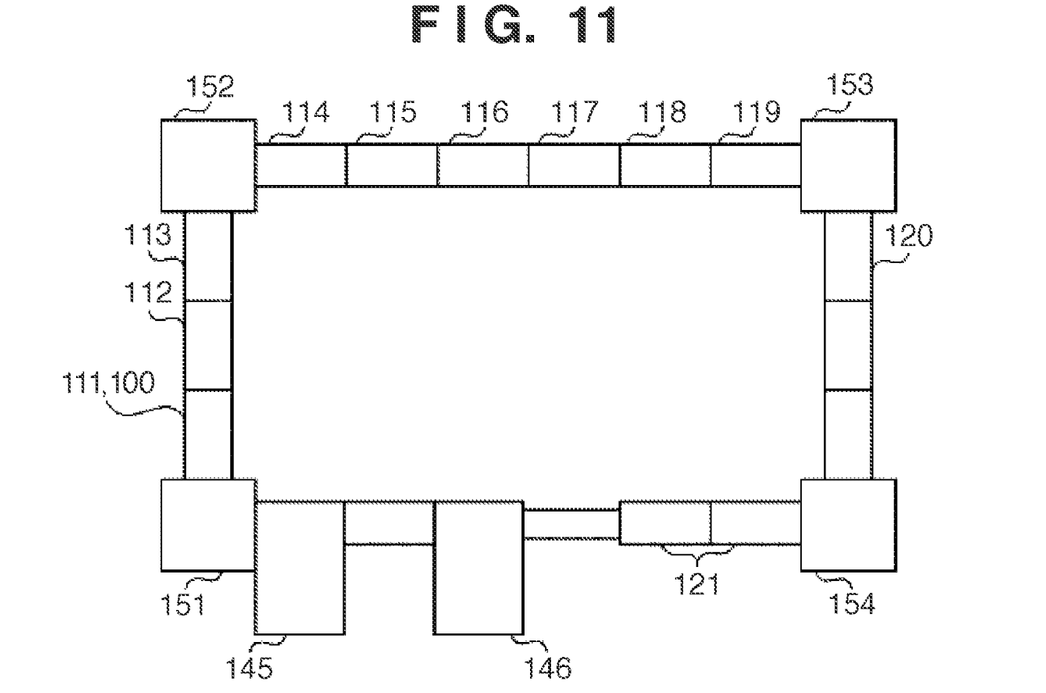
FIG. 11 is a block diagram of the schematic configuration of a manufacturing apparatus used for a method of manufacturing a magnetic recording medium according to the embodiment.

FIG. 11 is a block diagram of the schematic configuration of a manufacturing apparatus used for a method of manufacturing a magnetic recording medium according to the embodiment of the present invention. The manufacturing apparatus used for the method of manufacturing a magnetic recording medium according to the embodiment of the present invention is an in-line manufacturing apparatus in which a plurality of vacuum chambers 111 to 121 ... that can be evacuated to a vacuum are connected to each other without end in a rectangular shape, as shown in FIG. 11. A transport path for transporting a substrate to an adjacent vacuum chamber is formed in each of the vacuum chambers 111 to 121 ... , and the substrate sequentially undergoes processes in the respective vacuum chambers while circulating within the manufacturing apparatus. Also, the direction to transport the substrate is changed in direction changing chambers 151 to 154, so the direction to transport the substrate which is rectilinearly transported between the chambers is changed by 90° in the direction changing chambers 151 to 154, and thereupon the substrate is transferred to the next chamber. Moreover, a substrate is loaded into the manufacturing apparatus by a load lock chamber 145, and is unloaded from the manufacturing apparatus by an unload lock chamber 146 upon completion of processes. Note that a plurality of chambers in which the same process can be executed may be continuously arranged to perform the same process by a plurality of times, as exemplified by the chamber 121. This makes it possible to perform a process which requires a long time without prolonging the takt time. Although only the chamber 121 includes a plurality of chambers in FIG. 11, other chambers may include pluralities of chambers. Note that the plasma processing apparatus according to the embodiment of the present invention is adopted as the vacuum chamber 111.

Figure 12:
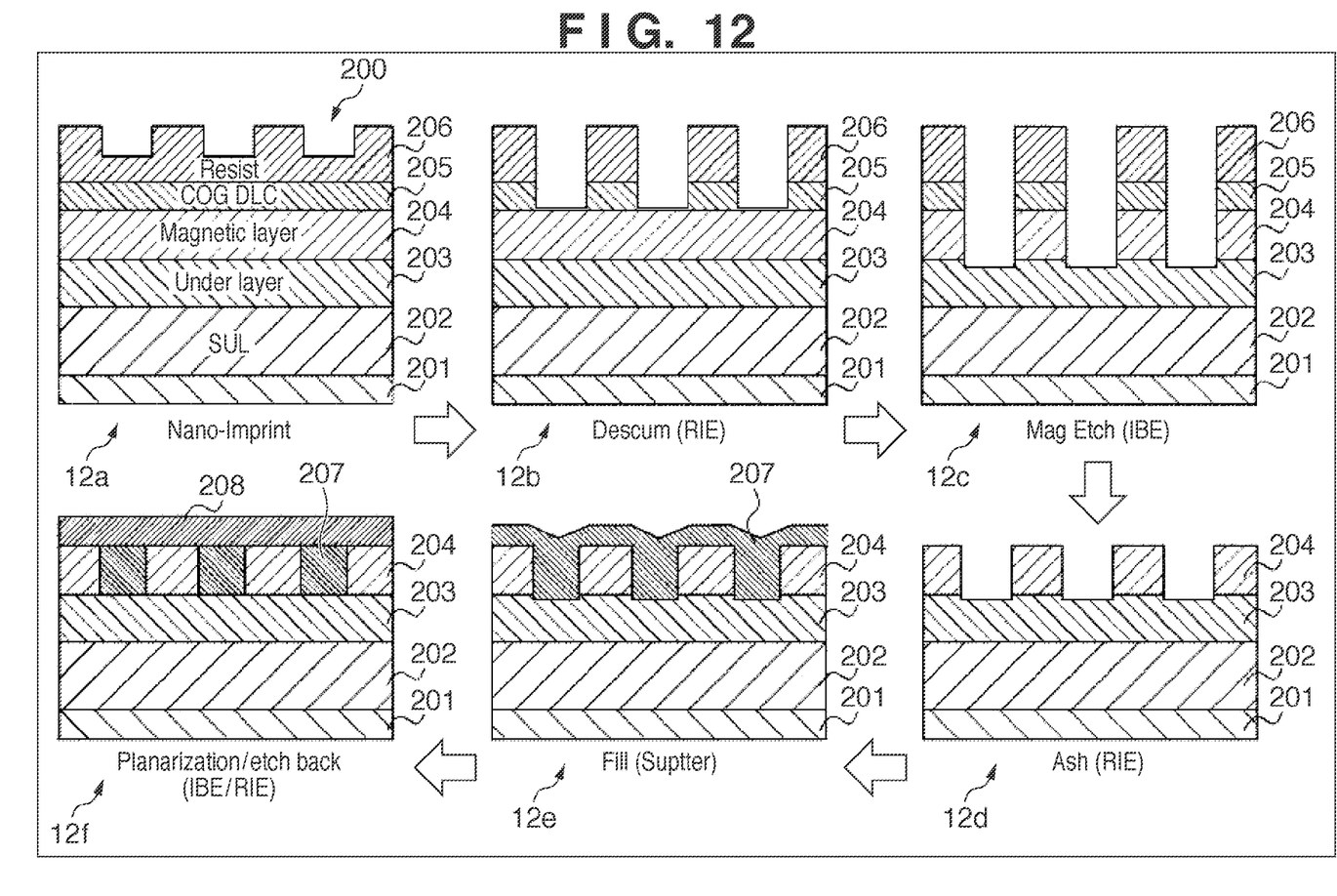
FIG. 12 is a schematic view of a stacked body processed by the apparatus for manufacturing a magnetic recording medium according to the embodiment.

To process the substrate held by the substrate holder, the method of manufacturing a magnetic recording medium, executed by the manufacturing apparatus shown in FIG. 11, includes a step of introducing a process gas into the discharge chamber 25, a step of introducing a reactive gas into the discharge chamber 25, and a step of generating a plasma inside the discharge chamber 25 by the high-frequency power application mechanism. FIG. 12 is a schematic view of a stacked body processed by the apparatus for manufacturing a magnetic recording medium according to the embodiment of the present invention. A stacked body 200 is in the process of being processed into a discrete track magnetic recording medium (DTM), as shown in FIG. 12. The stacked body 200 includes a substrate 201, soft magnetic layer 202, under layer 203, recording magnetic layer 204, mask layer 205, and resist layer 206, and is charged into the manufacturing apparatus shown in FIG. 11. A 2.5-inch (65-mm) diameter glass substrate or aluminum substrate, for example, can be used as the substrate 201. The soft magnetic layer 202 serves as a yoke for the recording magnetic layer 204, and is formed from a soft magnetic material such as an Fe alloy or a Co alloy. The under layer 203 is used to orient the easy axis of the recording magnetic layer 204 in the vertical direction (in the direction in which the stacked body 200 is stacked), and is formed from, for example, a stacked body of Ru and Ta. The recording magnetic layer 204 is magnetized in the direction perpendicular to the substrate 201, and is formed from, for example, a Co alloy.

The mask layer 205 is used to protect the recording magnetic layer 204, and can be formed using, for example, diamond-like carbon (DLC). The resist layer 206 is used to transfer a trench pattern onto the recording magnetic layer 204. In this embodiment, a trench pattern is transferred onto the resist layer by the nano-imprint method, and the stacked body 200 is charged into the manufacturing apparatus shown in FIG. 11 in this state. Note that a trench pattern may be transferred by exposure and development, instead of using the nano-imprint method.

The manufacturing apparatus shown in FIG. 11 continuously removes trenches in the resist layer 206 and mask layer 205 by reactive ion etching in the first vacuum chamber, as shown in 12a of FIG. 12, thereby exposing the recording magnetic layer 204 to the trenches, as shown in 12b of FIG. 12. More specifically, the plasma processing apparatus according to the embodiment of the present invention is used, and, as the etching conditions, the chamber pressure is set to about 0.25 Pa, and the RF power in inductively coupled plasma (ICP) discharge is set to about 200 W. A mixed gas of Ar and oxygen was introduced from the gas supply system into the discharge chamber 25 as a reactive gas. The flow rate of argon gas was set to 30 sccm, and that of oxygen gas was set to 5 sccm. A bias voltage (a DC, Pulse-DC, or RF bias voltage) of about −50 V was applied to the coil. DLC can also be deposited by the CVD method using, as a reactive gas, a hydrocarbon gas such as $C_2H_4$ in place of oxygen gas. The present invention is also effective in film thickness distribution control in this deposition.

In the second vacuum chamber 112, the recording magnetic layer 204 exposed to the trenches is removed by ion beam etching, as shown in 12b of FIG. 12, thereby forming the recording magnetic layer 204 into a three-dimensional pattern in which respective tracks are radially spaced apart from each other, as shown in 12c of FIG. 12. For example, the pitch (trench width+track width) is 70 to 100 nm, the trench width is 20 to 50 nm, and the thickness of the recording magnetic layer 204 is 4 to 20 nm at this time. In this way, a process of forming the recording magnetic layer 204 into a three-dimensional pattern is performed.

In the third vacuum chamber 113, the resist layer 206 and mask layer 205 on the projections of the recording magnetic layer 204 formed into a three-dimensional pattern are removed by reactive ion etching, as shown in 12*d* of FIG. 12. In the fourth vacuum chamber 114, the trenches (recesses) in the recording magnetic layer 204 formed into a three-dimensional pattern are filled with a burying layer 207 made of a nonmagnetic material by sputter deposition, as shown in 12*e* of FIG. 12. In the fifth vacuum chamber 115, any excess sputtered film (burying layer) deposited on the magnetic layer is removed by etching, thereby planarizing the surface of the magnetic layer. A DLC layer 208 is deposited on the planarized surface, as shown in 12*f* of FIG. 12.

In this embodiment, this deposition is performed in the protective film forming chamber 121 after the heating chamber 120 or a cooling chamber is adjusted to the temperature required to form diamond-like carbon (DLC). The present invention is also effective in film thickness distribution control in this deposition.

As described above, the in-plane uniformity of etching can be improved using the plasma processing apparatus according to the embodiment of the present invention for the reactive ion etching method.

Although the shielding member according to the present invention is adopted for an apparatus including the substrate holder 2 which holds the principal surface of a substrate upright (vertically) in the above-described embodiment, the present invention is not limited to this, and this member may be adopted for an apparatus including a substrate holder which holds the principal surface of a substrate laterally (horizontally). However, because the apparatus including a substrate holder which holds a substrate laterally (horizontally) poses a problem that the film adhering onto the shielding member falls onto the substrate and forms particles, the shielding member is preferably adopted for the apparatus including a substrate holder which holds a substrate upright.

In the above-described embodiment, the pair of shielding members according to the present invention are adopted for a plasma processing apparatus including a pair of discharge chambers which face each other through the substrate holder 2 which holds the principal surface of a substrate upright (vertically). Because such an apparatus which processes the two surfaces of a substrate cannot be provided with a mechanism which rotates the substrate, due to constraints on the apparatus, the present invention is preferably applied to this apparatus.

The present invention is not limited to the above-described embodiments, and various changes and modifications can be made within the spirit and scope of the present invention. Therefore, to apprise the public of the scope of the present invention, the following claims are made.

The invention claimed is:

1. A plasma processing apparatus comprising:
a discharge window made of a dielectric material;
a discharge chamber which is grounded and includes an opening formed at one end thereof and said discharge window provided at the other end thereof facing the opening;
a gas supply system which supplies a gas into said discharge chamber;
a high-frequency power application mechanism which applies a high-frequency power to the gas to generate a plasma inside said discharge chamber;
a substrate holder which can hold a substrate while facing said discharge window on an outer side of said discharge chamber;
a shielding member which partially shields the plasma that impinges on the substrate; and
a supporting member which supports said shielding member,
wherein said supporting member supports said shielding member at a position which is farther from a portion at which said shielding member faces the substrate, and
wherein said supporting member is grounded and fixed at a position which is different from a position of said discharge window.

2. The plasma processing apparatus according to claim 1, wherein a distance between said discharge window and said supporting member is not less than 30 mm.

3. The plasma processing apparatus according to claim 1, wherein a surface of said shielding member is disposed by said supporting member to be parallel to a surface of the substrate which can be held by said substrate holder.

4. The plasma processing apparatus according to claim 1, wherein said shielding member is supported by said supporting member to face the center of the substrate which can be held by said substrate holder.

5. The plasma processing apparatus according to claim 1, wherein a distance between said shielding member and said supporting member is not less than 3 mm.

6. The plasma processing apparatus according to claim 1,
wherein said substrate holder holds the substrate having two surfaces as target surfaces while the substrate stands upright, and
wherein said discharge chamber, said gas supply system, said high-frequency power application mechanism, said shielding member, and said supporting member are provided in correspondence with each of the target surfaces.

* * * * *